US008498309B2

(12) United States Patent
Campini et al.

(10) Patent No.: US 8,498,309 B2
(45) Date of Patent: Jul. 30, 2013

(54) DATA TRANSPORT MODULE

(75) Inventors: Edoardo Campini, Mesa, AZ (US);
David Formisano, Chandler, AZ (US);
Marwan Khoury, San Jose, CA (US);
Bradley T. Herrin, Lake Forest, CA (US)

(73) Assignee: Intel Corporation, Santa Clara, CA (US)

( * ) Notice: Subject to any disclaimer, the term of this patent is extended or adjusted under 35 U.S.C. 154(b) by 1391 days.

(21) Appl. No.: 11/131,858

(22) Filed: May 18, 2005

(65) Prior Publication Data

US 2006/0262781 A1 Nov. 23, 2006

(51) Int. Cl.
*H04J 3/16* (2006.01)
*H04J 3/22* (2006.01)
*H05K 7/16* (2006.01)

(52) U.S. Cl.
USPC ............................ 370/466; 361/725; 361/788

(58) Field of Classification Search
USPC ...... 370/466; 361/788, 679, 726, 725; 439/61
See application file for complete search history.

(56) References Cited

U.S. PATENT DOCUMENTS

| | | | | |
|---|---|---|---|---|
| 4,846,699 A | * | 7/1989 | Glover et al. | 439/64 |
| 4,908,823 A | * | 3/1990 | Haagens et al. | 370/464 |
| 5,058,110 A | * | 10/1991 | Beach et al. | 370/464 |
| 5,581,130 A | * | 12/1996 | Boucheron | 307/10.1 |
| 5,764,927 A | | 6/1998 | Murphy et al. | |
| 6,477,303 B1 | * | 11/2002 | Witherspoon | 385/52 |
| 6,611,526 B1 | | 8/2003 | Chinnaswamy et al. | |
| 6,662,247 B1 | | 12/2003 | Ales et al. | |
| 6,662,255 B1 | * | 12/2003 | Klein | 710/301 |
| 6,785,149 B2 | * | 8/2004 | Gilliland et al. | 361/796 |
| 6,805,560 B1 | | 10/2004 | Budny et al. | |
| 7,010,232 B1 | * | 3/2006 | Ott | 398/164 |
| 7,088,735 B1 | * | 8/2006 | Reohr et al. | 370/466 |
| 7,149,093 B2 | * | 12/2006 | Conway | 361/788 |
| 7,159,062 B2 | * | 1/2007 | Byers et al. | 710/305 |
| 7,281,076 B2 | * | 10/2007 | Yates et al. | 710/305 |
| 2003/0079056 A1 | * | 4/2003 | Taylor | 710/1 |
| 2005/0099772 A1 | | 5/2005 | Wei | |
| 2005/0179982 A1 | * | 8/2005 | Patel et al. | 359/291 |
| 2005/0185790 A1 | * | 8/2005 | Le Quere | 380/28 |

(Continued)

FOREIGN PATENT DOCUMENTS

| | | |
|---|---|---|
| CN | 2517225 | 10/2002 |
| EP | 0 401 588 A2 | 12/1990 |
| JP | 07 336075 A | 12/1995 |
| WO | WO 2006/124515 A2 | 11/2006 |

OTHER PUBLICATIONS

International Search Report and Written Opinion, International Application No. PCT/206/18243, Mailed Aug. 8, 2007, 12 pages.

(Continued)

*Primary Examiner* — Ayaz Sheikh
*Assistant Examiner* — Hoang-Chuong Vu
(74) *Attorney, Agent, or Firm* — Robert A. Greenberg

(57) ABSTRACT

A data transport module includes a connector to be received and coupled to a backplane within a modular platform. The data transport module also includes another connector to be received and coupled in a slot resident on a board such that the data transport module is coplanar to the board when received and coupled in the slot. The data transport module further includes one or more data transport interfaces to forward data between the board and the backplane via the connectors.

14 Claims, 5 Drawing Sheets

U.S. PATENT DOCUMENTS

| | | | |
|---|---|---|---|
| 2005/0191056 A1* | 9/2005 | Coffey | 398/79 |
| 2005/0240814 A1* | 10/2005 | Sasakura et al. | 714/14 |
| 2005/0270974 A1* | 12/2005 | Mayhew | 370/229 |
| 2008/0225474 A1* | 9/2008 | Flynn et al. | 361/683 |

OTHER PUBLICATIONS

International Preliminary Report on Patentability, International Application No. PCT/206/18243, Mailed Nov. 29, 2007, 7 pages.

PCI Industrial Computer Manufacturers Group (PICMG), Advanced Telecommunications Computing Architecture (ATCA) Base Specification, PICMG 3.0 Rev. 1.0, published Dec. 30, 2002.

Institute of Electrical and Electronics Engineers (IEEE) standard 802.3ah-2004 Information technology—Telecommunications and information exchange between systems—Local and metropolitan networks—Specific requirements—Part 3: Carrier Sense Multiple Access with Collision Detection Access Method and Physical Layer Specifications, published Sep. 9, 2004.

PCI-Express Base Specification, Rev. 1.1, published Mar. 28, 2005.

Advanced Switching Core Architecture Specification, Rev. 1.0, published Dec. 2003.

SPI-4 Implementation Agreement, Phase 2 Revision 1: OC-192 System Interface for Physical and Link Layer Devices, published Oct. 15, 2003 and available through the Optical Internetworking Forum (OIF).

Intel IXDP995E Advanced Development Platform, System User's Manual, Published May 2004 by Intel Corporation.

First Office Action for Chinese Patent Application No. 200680016710.7 mailed Oct. 30, 2009, 8 pages.

Second Office Action for Chinese Patent Application No. 200680016710.7 mailed Jul. 12, 2010, 4 pages.

Official Letter for Taiwanese Patent Application No. 95115882, Mailed Nov. 25, 2010, 3 pages.

Communication pursuant to Article 94(3) EPC for European Patent Application No. 06752509.7-1242, Mailed Apr. 8, 2011, 4 pages.

* cited by examiner

DATA TRANSPORT MODULE

BACKGROUND

Modular platform systems are typically used in communication networks where reliability is increased and cost reduced by the use of interoperable pieces. Such interoperable pieces may include modular platform shelves or chassises. These modular platform shelves include one or more backplanes that receive and couple to other interoperable pieces such as circuit boards or "boards". These boards may include, but are not limited to blades, carrier boards, processing boards, interconnects, etc. Other interoperable pieces that a backplane may receive and couple to include components such as fans, power equipment modules (PEM), field replaceable units (FRUs), alarm boards, etc.

Backplanes within a modular platform system may receive and couple boards via one or more data transport and power connectors. Typically, the one or more data transport connectors include communication links to interconnect boards received and coupled to the backplane. These communication links may also couple interconnected boards to components resident on a given board (e.g, mezzanine cards, processing elements, chipsets, media devices, etc.). Data and/or instructions are forwarded on these communication links using various different communication protocols. Typically a data transport interface is used to serve as a bridge between the communication links that use different communication protocols.

DETAILED DESCRIPTION

Typically, boards designed to couple to a backplane within a modular platform include resident data transport interfaces. Various board designs may be needed to accommodate different types of data transport interfaces. The different types of data transport interfaces may support one or more given communication protocols used to forward data and/or instructions over communication links between a board and a backplane. Multiple designs increase manufacturing costs and may reduce a board's reliability due to uncertainty in the board's compatibility to backplanes with communication links using multiple communication protocols. Additionally, each time a communication protocol is updated or changed, a consequent redesign of a board and a resident data transport interface is likely necessary. Accordingly, data transport interfaces resident on a board are problematic to a cost effective and reliable board for a modular platform in a communication network.

Figure 1:
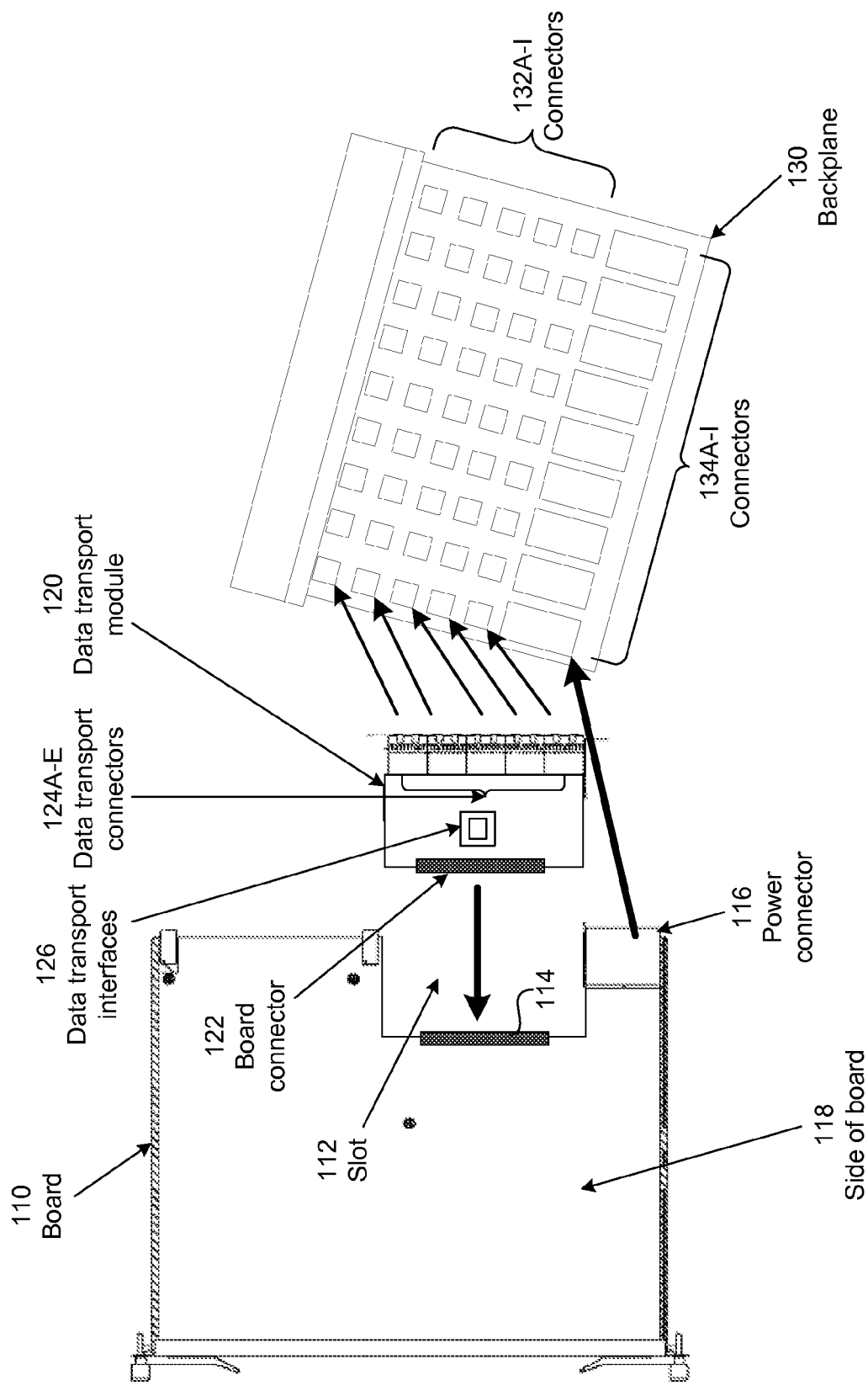
FIG. 1 is an example illustration of a data transport module to be received and coupled to a slot on a board and to be received and coupled to a backplane.

FIG. 1 is an example illustration of a data transport module 120 to be received and coupled to a slot 112 on a board 110 and to be received and coupled to a backplane 130. As depicted in FIG. 1, data transport module 120 includes a board connector 122 to be received and coupled to board 110 via a slot 112 that includes connector 114.

Data transport module 120 is also depicted to be received and coupled to backplane 130 via data transport connectors 124A-E. Data transport connectors 124A-E, for example, may couple to backplane 130 via backplane 130's connectors 132A-I. As described in more detail below, data transport 120 also includes one or more data transport interfaces 126 to facilitate the forwarding of data and/or instructions between board 110 and backplane 130.

Board 110 also includes a power connector 116 to couple to backplane 130 (e.g., via connectors 134A-I). In one example, backplane 130 provides power feeds through connector 134A to board 110 and to data transport module 120 when coupled to power connector 116.

In one example, board 110 may be a board designed to operate in compliance with the PCI Industrial Computer Manufacturers Group (PICMG), Advanced Telecommunications Computing Architecture (ATCA) Base Specification, PICMG 3.0Rev. 1.0, published Dec. 30, 2002, and/or later versions of the specification ("the ATCA specification"). Additionally, backplane 130 may also be designed to operate in compliance with the ATCA specification, although this disclosure is not limited to only ATCA compliant boards and backplanes but may also apply to Compact Peripheral Component Interface (cPCI) compliant boards, VersaModular Eurocard (VME) compliant boards, or other types of industry standards governing the design and operation of backplanes and boards. In addition, this disclosure may also apply to proprietary boards and/or backplanes designed to operate in a modular platform system.

In one implementation, data transport connectors 124A-E are to couple to ATCA backplane 130 in an ATCA backplane region called "Zone 2" via connectors 132A-I. The ATCA specification refers to connectors that couple in Zone 2 as "data transport" connectors. These connectors include communications links to route data and/or instructions between board 110 (e.g., via data transport module 120) and other boards coupled to backplane 130. The communication links include, but are not limited to, "switch fabric" or "base fabric" communication links.

In one example, data transport connectors 124A-E, may also include connectors to couple to "Zone 3" data transport connectors in an ATCA modular platform. Zone 3 data transport connectors, for example, may couple to input/output devices such as rear transition modules (RTMs). These Zone 3 connectors may include switch and/or base fabric communication links.

A base fabric interface on an ATCA compliant board is designed to support 10/100/1000 BASE-T Ethernet communication protocols ("Ethernet") over a base fabric. Ethernet associated communication protocols, for example, are described in the Institute of Electrical and Electronics Engineers (IEEE) standard 802.3ah-2004 Information technology—Telecommunications and information exchange between systems—Local and metropolitan networks—Specific requirements—Part 3: Carrier Sense Multiple Access with Collision Detection Access Method and Physical Layer Specifications, published Sep. 7, 2004, and/or later versions of the standard (the "Ethernet standard").

In one example, base fabrics may facilitate the routing of data and/or instructions between a board coupled to a backplane and a management and/or control board described in the ATCA specification as a "shelf manager controller" (ShMC). Data and/or instructions which may include, but are limited to, management and/or control instructions may be forwarded between a ShMC and a board over a base fabric in a backplane using Ethernet communication protocols. These management and/or control instructions may facilitate, for example, remote management, real time monitoring of operating parameters (e.g., temperatures and voltages), distributed processing, fault tolerance, etc. of a modular platform and the boards coupled to the modular platform.

Typically, a switch fabric interface for an ATCA compliant board may be designed to support one or more communication protocols. These protocols are associated with and/or described by sub-set specifications to the ATCA specification and are typically referred to as the "PICMG 3.x specifications." The PICMG 3.x specifications include, but are not limited to, Ethernet/Fibre Channel (PICMG 3.1), Infiniband (PICMG 3.2), StarFabric (PICMG 3.3), PCI-Express/Advanced Switching (PICMG 3.4) and Advanced Fabric Interconnect/S-RapidIO (PICMG 3.5). In one example, one or more switch fabric interfaces designed to support a communication protocol associated with a PICMG 3.x specification may facilitate the forwarding of data and/or instructions between boards coupled to an ATCA backplane via a switch fabric.

In one example, connectors (e.g., data transport connectors 124A-E, connector 114, and/or connectors 134A-I) may be high density, impedance controlled connectors. In another example, these connectors may include high speed and dense interfaces that do not require a mechanical contact. These connectors may couple via other methods such as through optical, inductive or capacitive interfaces. These methods, for example, may incorporate the use of micro electromechanical systems (MEMS) which may be fabricated using silicon manufacturing technologies.

One example of an optical interface may be a two-dimensional MEMS-controllable microlens array that has been integrated with a Vertical-Cavity-Surface-Emitting-Laser (VCSEL) array using a flip-chip assembly. An example of an inductive interface may be an out-of-plane, three-turn spiral with micro (very small) coil dimensions. An example of a capacitive interface may be a parallel plate, area-tunable, MEMS capacitor. The disclosure is not limited to only the above mentioned interfaces.

In one implementation when data transport module 120 is received and coupled to board 110 it is coplanar with side 118 of board 110. This coplanar orientation, for example, may give board 110 the same profile as an ATCA compliant board that couples to a backplane via resident data transport connectors.

In one example, slot 112 in board 110 includes a cutout portion that has dimensions to accommodate the full length of data transport module 120 on the side that couples to connector 114. In addition, slot 112 accommodates at least a portion of data transport module 120's width. For example, the portion of width may be such that data transport connectors 124A-E when data transport module 120 is coupled to board 110 in a coplanar orientation, data transport connectors 124A-E will extrude from the edge of board 110 the same or similar distance as the resident data transport connectors on the edge of an ATCA compliant board.

In one example, data transport module 120 by itself is not "hot-swappable." However, once board 110 is received and coupled to backplane 130 via data transport module 120 and connector 116, board 110 with data transport module 120 functions as a hot-swappable board like any other board coupled to an ATCA compliant backplane.

Although not shown in FIG. 1, board 110 may include a rail mechanism to help guide and hold data transport module 120 in place. For example, a structure similar to a miniature "H" beam could be mounted to board 110 to function as a slide to guide the receiving and coupling of data transport module 120 within slot 112 to connector 114.

Figure 2:
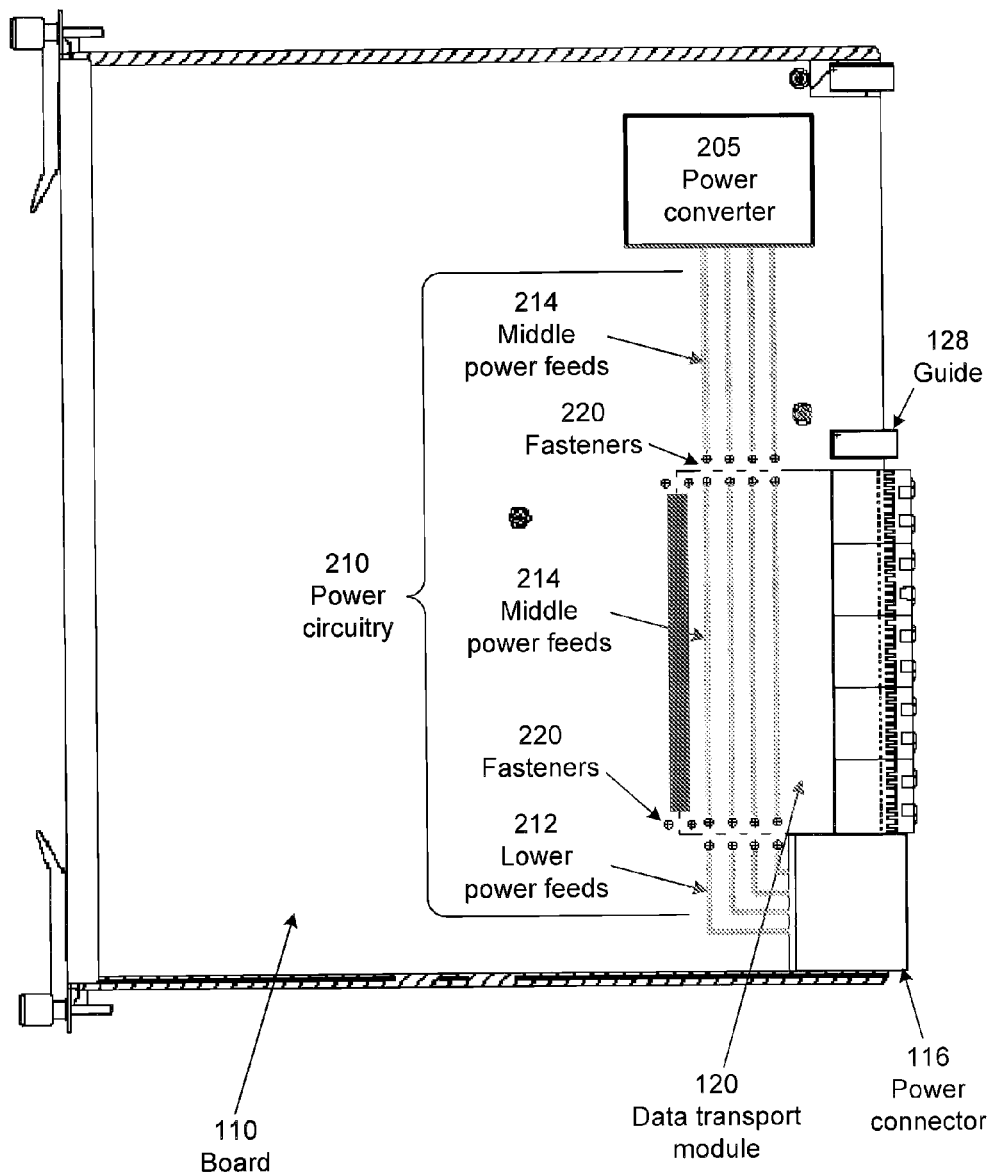
FIG. 2 is an example illustration of the data transport module received and coupled to the board.

FIG. 2 is an example illustration of data transport module 120 received and coupled to board 110. As depicted in FIG. 2, data transport module 120 may be fastened to board 110 using fasteners 220.

In one implementation, fasteners 220 may mechanically fasten data transport module 120 to board 110. Additionally, fasteners 220 may facilitate the routing of power feeds to power converter 205 via power circuitry 210, the power may be received through power connector 116 when coupled to a backplane (e.g., backplane 130). For example, fasteners 220 couple together portions of power circuitry 210 which includes lower power feeds 212, middle power feeds 214 and upper power feeds 216. As shown in FIG. 2, the lower and upper power feeds 212 and 216 are resident on board 110, while middle power feed 214 is resident on data transport module 120.

In one example, board 110 is an ATCA compliant board that receives primary and redundant −48 volts direct current (VDC) through power connector 116 when coupled to backplane 130. The −48 VDC is then routed through power circuitry 210 to power converter 205. Since, the air flow in a typical ATCA compliant modular platform shelf and/or rack flows from the bottom (where power connector 116 is located) to the top (where power converter 205 is located), this routing may facilitate the dissipation of heat generated by power converter 205. Power converter 205's location at the top may also reduce the thermal impact of power converter 205's waste heat on other devices on board 110. The thermal impact may be reduced since most of these devices will be downstream of the airflow in an ATCA compliant board.

In one example, board 110 may include a guide 128 as depicted in FIG. 2. Guide 128, for example, is resident on board 110 and may serve to help guide board 110, with data transport module 120 in place, as it is received and coupled to a backplane (e.g., backplane 130). In another example, guide 128 may be resident on data transport module 120. In this other example, guide 128 may also serve to help guide board 110's receipt and coupling to the backplane. In yet another example, a guide 128 may be on both board 110 and data transport module 120.

Figure 3:
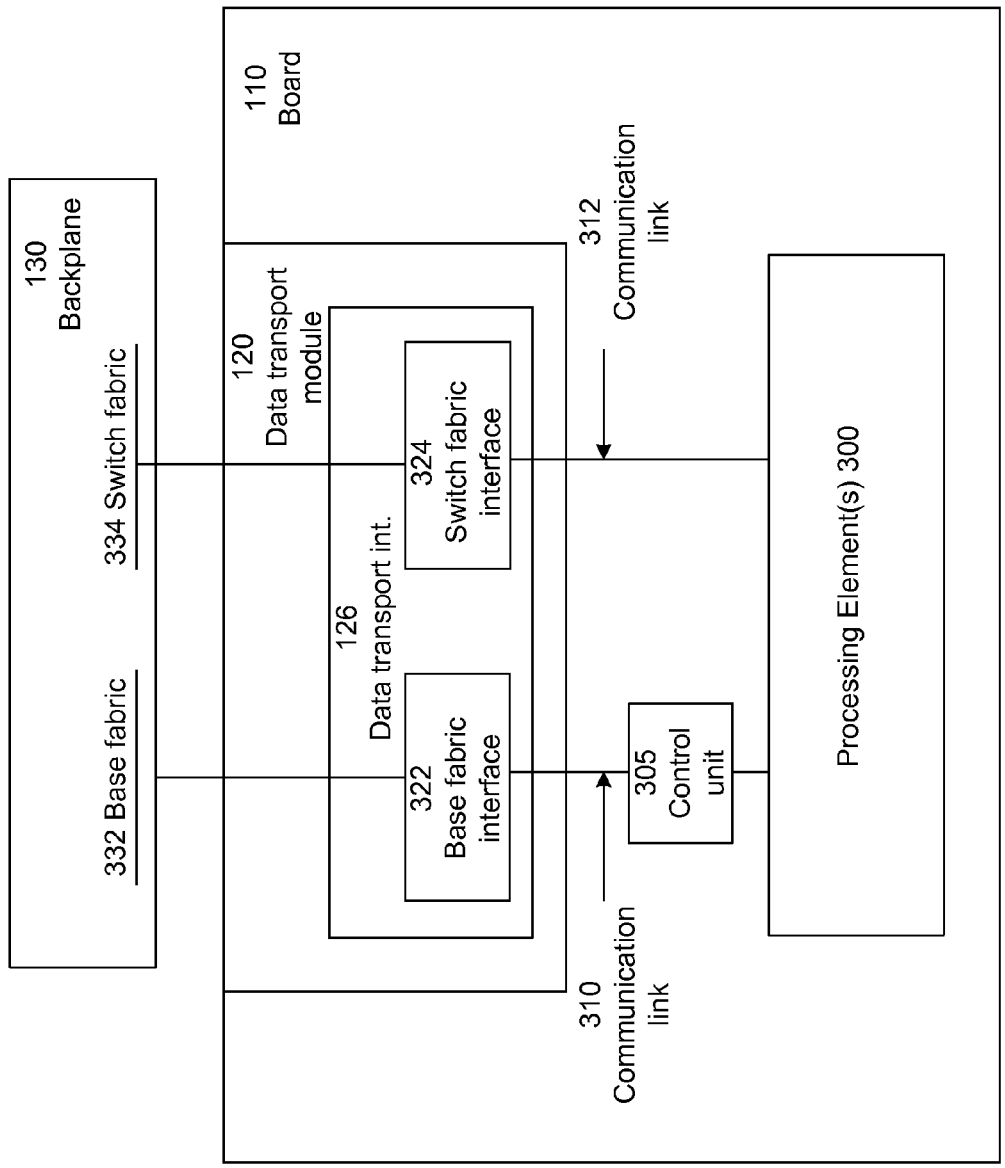
FIG. 3 is an example architectural diagram of the data transport module including data transport interfaces between the backplane and a processing element(s) resident on the board.

FIG. 3 is an example architectural diagram of data transport module 120 including data transport interfaces 126 between backplane 130 and processing element(s) 300 resident on board 110. As depicted in FIG. 3, data transport interfaces 126 includes data transport interfaces 322 and 324. In one implementation, data transport interface 322 (base fabric interface) is coupled to base fabric 332 and data transport interface 324 (switch fabric interface) is coupled to switch fabric 334. Communication links 310 and 312, respectively are also depicted in FIG. 3 as coupling data transport interfaces 322 and 324, respectively, to processing element(s) 300.

In one example, processing element(s) 300 include, but are not limited to, network processors (NP), digital signal processors (DSP), microprocessors, microcontrollers, field programmable gate arrays (FPGA), or application specific integrated chips (ASIC). Processing element(s) 300 may be resident on board 110 and/or may be resident on modules and/or components coupled to connectors resident on board 110 (e.g., mezzanine and/or advanced mezzanine cards, chipset controllers, management controllers, etc.).

In one example, a control unit 305 may be responsive to and/or resident on one or more processing element(s) 300. Control unit 305 may contain control logic to facilitate control and/or management of processing element(s) 300 coupled to backplane 130 via the base fabric 332.

In one example, board 110 is compliant with the ATCA specification and is coupled to backplane 130 which is also ATCA compliant. As mentioned above, the base fabric in an ATCA compliant backplane uses an Ethernet communication protocol to forward data and/or instructions, however, processing element(s) 300 may respond to and/or operate (e.g., through control unit 305) using communication protocols that are different than Ethernet. For example, processing element(s) 300 may operate using communication protocols such as those described in the PCI-Express Base Specification, Rev. 1.1, published Mar. 28, 2005, and/or later versions of the specification ("the PCI-Express specification"). Data transport interface 322 may serve as a bridge to facilitate the forwarding of data and/or instructions received over base fabric 332. Data transport interface 322 may translate Ethernet communication protocols associated with the data and/or instruction to PCI-Express communication protocols. Data transport interface 322 may then forward the data and/or instructions via communication link 310 to control unit 305 and/or processing element(s) 300 using the PCI-Express communication protocol.

In one example, an ATCA ShMC may forward management and/or control instructions on base fabric 132 in backplane 130 to processing element(s) 300. Once the instructions reach data transport interface 322, the Ethernet communication protocol associated with these instructions is translated to a PCI-Express communication protocol. The instructions are then forwarded to control unit 305 and/or processing element(s) 300 using the PCI-Express communication protocol. Processing element(s) 300 and/or control unit 305 may transmit responses to the management and/or control instructions using PCI-Express communication protocols. Therefore, for example, data transport interface 322 may translate PCI-Express to Ethernet and then use Ethernet communication protocols to forward the response data on base fabric 332 to the ATCA ShMC.

In one implementation, switch fabric 334 may facilitate the forwarding of data to/from board 110 utilizing one or more of the communication protocols referenced in a PICMG 3.x specification, although switch fabric communication protocols are not limited to only those mentioned in a PICGM 3.x specification. In one example, switch fabric 334 may associate data and/or instructions with a communication protocol referenced in the PICMG 3.4 specification as the Advanced Switching Interconnect (ASI) communication protocol. The ASI communication protocol is described in detail in the Advanced Switching Core Architecture Specification, Rev. 1.1, published November 2004, and/or later versions of the specification ("the AS specification").

In one example, switch fabric 334 may use the ASI communication protocol to forward data and/or instructions to processing element(s) 300. However, processing element(s) 300 may operate and/or forward data using a communication protocol that is different than the ASI communication protocol. For example, processing element(s) 300 may forward data using a communication protocol associated with system packet interfaces (SPI) over communication link 312. One such SPI communication protocol is SPI-4 as described in the SPI-4 Implementation Agreement, Phase 2 Revision 1: OC-192 System Interface for Physical and Link Layer Devices, published Oct. 15, 2003 and available through the Optical Internetworking Forum (OIF).

In one implementation, data transport interface 324 may serve as a bridge to facilitate the forwarding of data received via switch fabric 334. This data may be forwarded, for example, using the ASI communication protocol and may be destined for processing element(s) 300 on board 110 that operate using the SPI-4 communication protocol. In this implementation, the ASI communication protocol associated with the data is translated by data transport interface 324 to the SPI-4 communication protocol and the data is then forwarded to processing element(s) 300 via communication link 312 using the SPI-4 communication protocol.

In one example, data transport module 120 includes only data transport interface 324. In this example, base fabric 332 may be routed through data transport module 120 to a base interface on board 110. In another example, data transport module 120 includes only data transport interface 322. In this example, the switch fabric is routed through data transport module 120 to a switch fabric interface on board 110.

Figure 4:
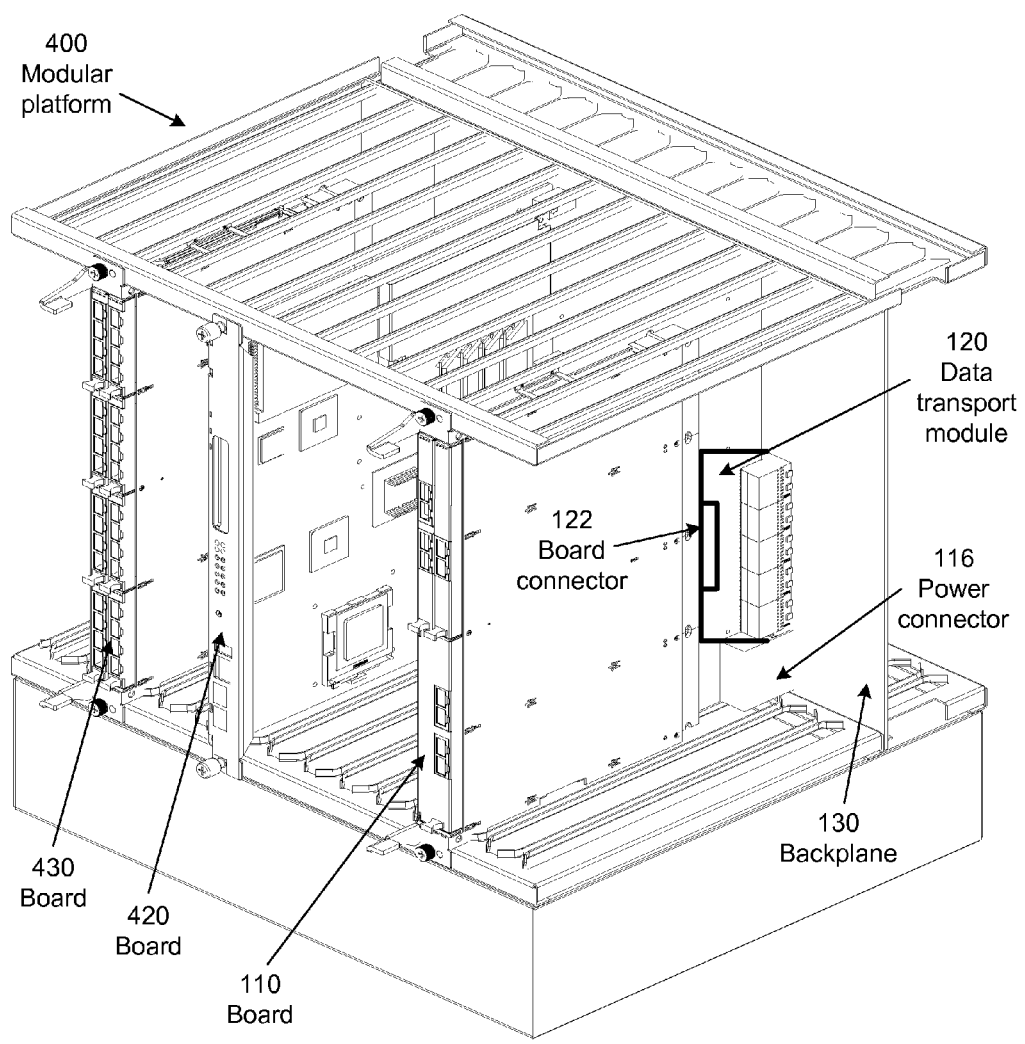
FIG. 4 provides a partial view of an example modular platform.

FIG. 4 provides a partial view of an example modular platform 400. Modular platform 400 may be a telecommunications server designed to be compliant with the ATCA specification. As mentioned above for boards and backplanes, modular platforms are not limited to only ATCA compliant modular platforms. FIG. 4 shows a partial view of modular platform 400 having selected portions removed for clarity.

Modular platform 400 is shown including boards 110, 420 and 430 coupled to backplane 130. In one example, as described above and depicted in FIG. 1, board 110 may couple to connectors 132A-I on backplane 130 via data transport module 120. Additionally, power connector 116 may couple to backplane 130 to provide power feeds to both board 110 and to data transport module 120.

In one example, boards 420 and 430 may also couple to backplane 130 via a data transport module and a power connector (not shown). Boards 420 and 430 may also couple directly to backplane 130 without a data transport module. Instead, boards 420 and 430 may couple via data transport connectors resident on these boards.

In one implementation, board 420 may serve as an ATCA ShMC for modular platform 400 and may transmit management and/or control instructions via base fabric 332 to processing element(s) 300 on board 110 using the Ethernet communication protocol. The Ethernet communication protocol may be translated to a different communication protocol by data transport interface 322 and the data and/or instructions forwarded to control unit 305 and/or processing element(s) 300 via communication link 310 using the different communication protocol.

In one implementation, data and/or instructions may be forwarded from processing element(s) 300 on board 110 to board 430. For example, the data and/or instructions may require further processing by processing elements on board 430. Data transport interface 324 may translate the communication protocol used to forward data and/or instructions (e.g., SPI-4) to a different communication protocol used by switch fabric 334 (e.g., ASI). The data and/or instructions are then forwarded through switch fabric 334 in backplane 130 to board 430 using the different communication protocol.

Figure 5:
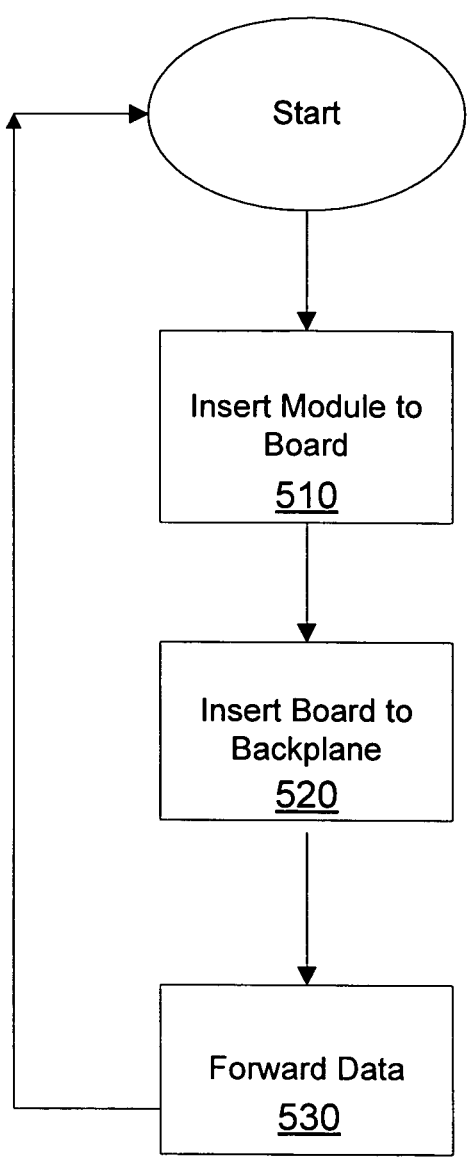
FIG. 5 is a flow chart of an example method to insert the data transport module into a slot on the board.

FIG. 5 is a flow chart of an example method to insert data transport module 120 in slot 112 on board 110. In block 510, data transport module 120 is inserted in slot 112 on board 110. When inserted, for example, board connector 122 is received and coupled in slot 112 so that data transport module 120 fits within slot 112 such that data transport module 120 is coplanar to board 110 (see FIG. 1). As described above, data transport module includes data transport connectors 124A-E to couple to, for example, backplane 130 in modular platform 400 (see FIG. 4).

In block 520, board 110, is inserted in backplane 130. For example, data transport connectors 124A-E on data transport module 120 are received and coupled to connectors 132A on backplane 130. Additionally, power connector 116 is received and coupled to connector 134A.

In block 530, once board 110 is coupled to backplane 130, data and/or instructions are forwarded to/from board 110 via one or more data transport interfaces 126 (e.g., data transport interfaces 332 or 324) on data transport module 120. The data and/or instructions may be routed from backplane 130 via base fabric 332 and/or switch fabric 334. As described above, the data transport interfaces may facilitate the forwarding of data and/or instructions to/from processing element(s) 300 on board 110.

The process then starts over, for example, when another data transport module is inserted in a board that is to be inserted in backplane 130 in modular platform 400.

In the previous descriptions, for the purpose of explanation, numerous specific details were set forth in order to provide an understanding of this disclosure. It will be apparent that the disclosure can be practiced without these specific details. In other instances, structures and devices were shown in block diagram form in order to avoid obscuring the disclosure.

References made in the specification to the term "responsive to" are not limited to responsiveness to only a particular feature and/or structure. A feature may also be "responsive to" another feature and/or structure and also be located within that feature and/or structure. Additionally, the term "responsive to" may also be synonymous with other terms such as "communicatively coupled to" or "operatively coupled to," although the term is not limited in his regard.

What is claimed is:

1. A system, comprising:
    an electronic card configured for insertion into a chassis having a backplane, the electronic card comprising:
        a first electronic card power input to receive power from the backplane;
        an electronic card power output to provide power to a data transport module;
        a second electronic card power input to receive power from the data transport module; and
    the data transport module, the data transport module configured to be attached to the electronic card such that the data transport module is coplanar with the electronic card when attached and is sized such that when attached to the electronic card, the data transport module and electronic card together form an edge with extruded data transport conductors, the data transport module comprising:
        a data transport module power input to receive power from the electronic card;
        a data transport module power output to provide power from the data transport module to the electronic card;
        a first data transport interface to carry data between the electronic card and the data transport module;
        a second data transport interface having the extruded data transport conductors to carry data between the data transport module and the backplane of the chassis;
        circuitry communicatively coupled to the first data transport interface and the second data transport interface, the circuitry to, when in operation, translate a first communication protocol associated with the first data transport interface with a second, different communication protocol associated with the second data transport interface;

wherein the first data transport interface is on a side of the data transport module opposite to the second data transport interface;
    wherein the data transport module power input is on a side of the data transport module opposite to the data transport module power output;
    wherein the data transport module power input is not on the same side of the data transport module as the first data transport interface;
    wherein the data transport module power input is not on the same side of the data transport module as the second data transport interface;
    wherein the data transport module power output is not on the same side of the data transport module as the first data transport interface; and
    wherein the data transport module power output is not on the same side of the data transport module as the second data transport interface.

2. The system of claim 1, wherein the electronic card and data transport module together comprise a carrier card.

3. The system of claim 2, wherein the carrier card comprises an ATCA (Advanced Telecommunications Computing Architecture) carrier card.

4. The system of claim 3, wherein the second data transport interface comprises a micro electromechanical system controlled microlens array.

5. The system of claim 3, wherein the second data transport interface comprises a parallel plate, area-tunable, micro electromechanical system capacitor.

6. The system of claim 2, wherein the second data transport interface comprises a micro electromechanical system.

7. The system of claim 1, wherein the data transport module power input comprises at least one fastener to couple the data transport module to the electronic card, the at least one fastener to route power from the electronic card to the data transport module.

8. The system of claim 1, wherein the first communication protocol comprises one of a peripheral component interface protocol and a system packet interface protocol.

9. The system of claim 1, wherein the second communication protocol comprises one of an Ethernet protocol.

10. The system of claim 1, wherein the electronic card comprises power conversion circuitry coupled to the second electronic card power input.

11. The system of claim 1, further comprising the chassis.

12. The system of claim 11, further comprising multiple inserted electronic cards into the chassis.

13. A data transport module to be attached to an electronic card configured for insertion into a chassis having a backplane, comprising:
    a data transport module power input to receive power from the electronic card;
    a data transport module power output to provide power from the data transport module to the electronic card;
    a first data transport interface to carry data between the electronic card and the data transport module;
    a second data transport interface having extruded data transport conductors to carry data between the data transport module and the backplane of the chassis, the second data transport interface comprising a base fabric interface and a switch fabric interface; and
    circuitry communicatively coupled to the first data transport interface and the second data transport interface, the circuitry to, when in operation, translate a first communication protocol associated with the first data transport interface with a second, different communication protocol associated with the second data transport interface;

wherein the data transport module has a shape and size such that the data transport module is coplanar with the electronic card if attached and the data transport module and electronic card together form an edge with the extruded data transport conductors if attached;

wherein the first data transport interface is on a side of the data transport module opposite to the second data transport interface;

wherein the data transport module power input is on a side of the data transport module opposite to the data transport module power output;

wherein the data transport module power input is not on the same side of the data transport module as the first data transport interface;

wherein the data transport module power input is not on the same side of the data transport module as the second data transport interface;

wherein the data transport module power output is not on the same side of the data transport module as the first data transport interface; and wherein the data transport module power output is not on the same side of the data transport module as the second data transport interface.

14. The fabric interface card of claim 13, wherein in the first communication protocol comprises a System Packet Interface (SPI) protocol.

* * * * *